(12) United States Patent
Kundalgurki

(10) Patent No.: US 7,005,385 B2
(45) Date of Patent: Feb. 28, 2006

(54) METHOD FOR REMOVING A RESIST MASK WITH HIGH SELECTIVITY TO A CARBON HARD MASK USED FOR SEMICONDUCTOR STRUCTURING

(75) Inventor: Srivatsa Kundalgurki, Dresden (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/734,593

(22) Filed: Dec. 15, 2003

(65) Prior Publication Data

US 2005/0130421 A1   Jun. 16, 2005

(51) Int. Cl.
*H01L 21/00* (2006.01)
*H01L 21/3065* (2006.01)

(52) U.S. Cl. ..................... 438/694; 438/710

(58) Field of Classification Search ........... 438/694, 438/700, 703, 710
See application file for complete search history.

(56) References Cited

U.S. PATENT DOCUMENTS

| | | | |
|---|---|---|---|
| 6,030,901 A * | 2/2000 | Hopper et al. | 438/711 |
| 6,492,272 B1 * | 12/2002 | Okada et al. | 438/690 |
| 6,562,700 B1 * | 5/2003 | Gu et al. | 438/477 |
| 6,630,406 B1 * | 10/2003 | Waldfried et al. | 438/710 |
| 2004/0144491 A1 * | 7/2004 | Ohuchi | 156/345.47 |

FOREIGN PATENT DOCUMENTS

JP    55-87438   *  7/1980

OTHER PUBLICATIONS

K. R. Williams et al., "Etch Rates for Micromachining Processing—Part II" Dec. 2003, vol. 12, Issue 6, pp. 761-778.*

* cited by examiner

*Primary Examiner*—Evan Pert
(74) *Attorney, Agent, or Firm*—Morrison & Foerster LLP

(57) ABSTRACT

The present invention relates to a method for removing a resist selective to a carbon hard mask including providing an etching plasma comprising of at least hydrogen at a predetermined temperature level and a predetermined pressure level in a reaction chamber, and etching the resist selectively to the mask with said plasma for a predetermined period of time.

13 Claims, 1 Drawing Sheet

METHOD FOR REMOVING A RESIST MASK WITH HIGH SELECTIVITY TO A CARBON HARD MASK USED FOR SEMICONDUCTOR STRUCTURING

TECHNICAL FIELD OF THE INVENTION

The present invention generally relates to semiconductor devices and more particularly to a method for removing a resist mask with high selectivity to a carbon hard mask used for semiconductor structuring.

BACKGROUND OF THE INVENTION

As is known in the art, mask layers, preferably hard mask layers, are deposited on semiconductor devices in order to structure the semiconductor devices in a predetermined manner. For photolithographically structuring the semiconductor device and/or the mask layer, a photo resist is commonly used. Such a photo resist is generally patterned by exposing the resist to electromagnetic waves of a predetermined wave-length range and patterned with a pattern device.

A cross-sectional view of a portion of a semiconductor device is shown in FIG. 2 which illustrates a semiconductor device 10, constituted preferably of Si, wherein as an example, a recess 11 has basically a rectangular shape in the cross-section of FIG. 2. A mask 12, preferably a carbon hard mask with a thickness of 170 nm as an example, is deposited on the semiconductor substrate 10. On top, a liner 13, preferably SiON with a thickness of 60 nm as an example is deposited according to FIG. 2.

For the structure shown in FIG. 2, a known stripping process for removing a photo resist (not shown in FIG. 2) mask was utilized. The resist was a carbon-type film which was removed by an oxygen-based etchant. The etchant plasma comprised for example 2000 sccm $O_2$ as well as 100 sccm $N_2$ at a pressure of e.g. 150 Pa and a temperature of 250° C. While stripping the photo resist on top of the liner layer 13, e.g. SiON, cavities 14 were formed in the carbon hard mask 12 as a parasitic side effect. Such erosion cavities 14 in the carbon hard mask 12 are highly undesirable since it leads to the etching of undesired features during subsequent processing. The formation of the cavities 14 is based on the attack of the carbon hard mask 12 by the oxygen rich plasma process used during the resist rework step at areas of weakness, especially at edges, corners and strongly bent portions of liner layer 13

FIG. 3 shows a structure basically similar to the structure according to FIG. 2 except that the cavities 14 and therefore the erosion of the carbon hard mask 12 on the semiconductor substrate 10 is substantially more pronounced. Leading to the structure of FIG. 3, a wet etch process was carried out three times to remove a photo resist (not shown in FIG. 3) from the surface of liner 13. Here, the vast cavities 14 formed in the carbon hard mask 12 on top of the semiconductor substrate 10 also result from the attack of the carbon hard mask by the wet etchant used during the resist stripping process at areas of weakness in the SiON liner layer 13.

SUMMARY OF THE INVENTION

In an effort to reduce erosion of a mask layer during a resist strip process, it is desirable to develop a resist strip method with a high selectivity to the underlying mask, preferably a carbon hard mask.

A preferred embodiment of the present invention provides a method for removing a resist mask from a liner on a mask. The method includes, for example, providing a plasma comprising of hydrogen at a predetermined temperature level and a predetermined pressure level in a reaction chamber, and etching the resist selectively to the mask with the plasma for a predetermined period of time.

In accordance with a further preferred embodiment, the hydrogen plasma could be diluted with Nitrogen so as to obtain a cost-effective and safe Forming gas chemistry for the resist strip application. A 96:4 Nitrogen to Hydrogen gas mixture is a standard Forming gas chemistry used in the semiconductor industry as an example.

In accordance with a further preferred embodiment of the present invention, the plasma comprising of a predetermined amount of $CF_4$, wherein the predetermined amount is for e.g. less than 5 per cent, preferably about 1 per cent. By the use of a small amount of $CF_4$, the selectivity from the resist to the Carbon hard mask can be further enhanced.

In accordance with a further embodiment, the resist etching plasma is free from oxygen. This bears the advantage of a solely reductive etchant for the resist strip.

In accordance with a further preferred embodiment, the predetermined pressure level of the etching plasma is in the range of 50 to 300 Pa, preferably about 150 Pa.

In accordance with a further preferred embodiment, the predetermined temperature level is in the range of 150° C. to 350° C., preferably about 250° C. With these process parameters a high removal rate of the resist still supplying a desired selectivity from the mask to the resist is advantageously provided.

In accordance with a further preferred embodiment, the carbon hard mask deposited for example using a chemical vapor deposition technique is used as an etch mask for semiconductor structuring.

In accordance with a further preferred embodiment, the resist mask is a carbon-based photo resist material.

In accordance with a further preferred embodiment, the liner preferably SiON is deposited on the carbon hardmask prior to depositing and stripping the resist.

In accordance with a further preferred embodiment, the semiconductor substrate is a Si-substrate. Best results of the resist stripping process were identified with aforesaid advantageous materials.

In accordance with a further preferred embodiment, the selectivity of the mask to the resist is equal or higher than 10.

In accordance with a further preferred embodiment, the resist is stripped with an across wafer uniformity of <3% one-sigma. Thereby, a highly selective removal of resist on a liner on top of a mask can be achieved with a high level of across wafer resist strip uniformity.

The foregoing section outlines rather broadly the features and technical advantages of embodiments of the present invention in order that the detailed description of the invention that follows may be better understood. Additional features and advantages of the present invention will be henceforth described. It should be appreciated that the concepts and specific embodiments disclosed may be readily utilized by those skilled in the art for carrying out the same purposes outlined in the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention and the advantages thereof, reference is now made to the following description taken in conjunction with the accompanying drawings, in which.

DETAILED DESCRIPTION OF THE INVENTION

The making and using of the presently preferred embodiments are discussed in detail below. It should be appreciated, however, that the present invention provides a widely applicable inventive concept that can be embodied in a wide variety of specific contexts. The specific embodiments discussed are merely illustrative of specific ways to make and use the invention, and do not limit the scope of the invention.

The present invention will be described with respect to preferred embodiments in a specific context, namely carbon photo resist removal on a carbon hard mask deposited on a semiconductor substrate. The invention may also be applied, however, to other stripping processes, such as removal of a sacrificial layer on a semiconductor substrate. The concepts of the present invention can be used with a variety of semiconductor devices including memories, CPUs, digital signal processors and amplifying devices.

Figure 1:
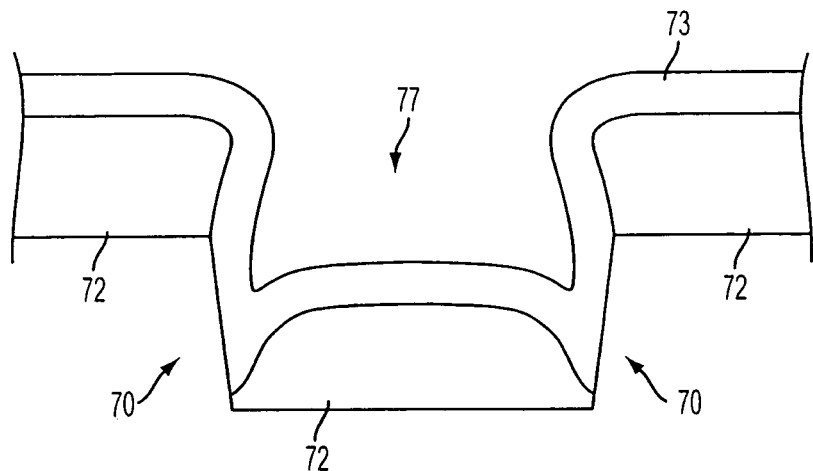
FIG. 1 illustrates a schematic cross-sectional view of a semiconductor substrate explaining a preferred embodiment method of the present invention.

A first embodiment will now be described with respect to FIG. 1. In FIG. 1, an exemplified recess 11 is provided in a semiconductor substrate 10. The semiconductor substrate 10 e.g. a semiconductor wafer is preferably a Si-semiconductor substrate. On the surface of the semiconductor substrate 10, a mask 12 is deposited. The mask 12 is preferably a hard mask, such as a carbon hard mask preferably deposited by CVD (chemical vapor deposition) and extends for example about 200 nm above the surface of said semiconductor substrate 10. The recess 11 in the semiconductor substrate as shown has a rectangular cross-section on which hard mask 12 is deposited. The convex shape of the hard mask 12 in the recess 11 is an unintentional result of the deposition of the hard mask 12 in the recess 11.

The carbon hard mask 12 outside the recess 11 protrudes the vertical etch line of the semiconductor substrate 10 also unintentionally as a result of the formation process of the carbon hard mask 12. An overlying liner 13, preferably consisting of SiON, is deposited basically evenly on the surface of the carbon hard mask The liner 13 acts as a barrier liner separating the mask 12 from a overlying resist. A resist, preferably a carbon photo resist (not shown in FIG. 1), which has been deposited on the shown structure is completely removed from the structure in accordance with FIG. 1.

For stripping the resist from the liner 13 overlying the carbon hard mask 12, a reductive etchant comprising hydrogen is/was used. Preferably an etching plasma with a flow of 1000 sccm of forming gas, comprising 96 per cent nitrogen $N_2$ and 4 per cent hydrogen $H_2$, was used for a predetermined time, for example 270 seconds, at a predetermined temperature level, for example 250° C., and a predetermined pressure level, for example 150 Pa. Using such an oxygen-free etching plasma, the selectivity between the liner 13 and the stripped resist of more than 10, can be reached.

Figure 2:
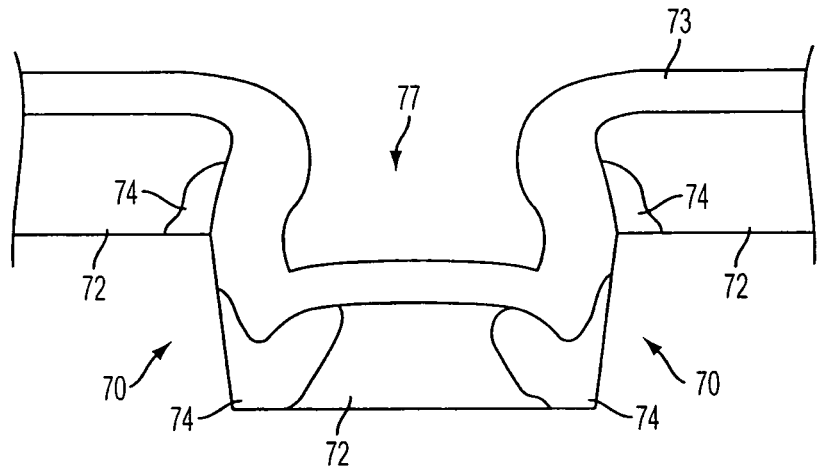
FIG. 2 illustrates a schematic cross-sectional view of a semiconductor substrate explaining a prior art formation process.
Figure 3:
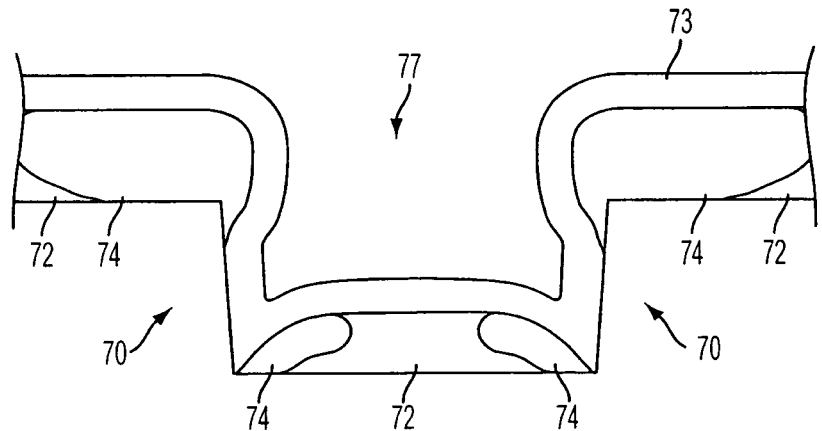
FIG. 3 illustrates a schematic cross-sectional view of a semiconductor substrate explaining a further prior art formation process.

As is apparent from FIG. 1, the carbon hard mask 12 shows no erosion symptoms, especially not in the areas of weakness existing in the liner layer 13 where said liner 13 is strongly bent around feature corners. Therefore, the stripping process to remove photo resist from a semiconductor wafer selectively to a mask 12 in accordance with the present invention using a reductive etchant comprising hydrogen is superior to the known stripping processes as described with reference to FIG. 2 and FIG. 3.

In a further preferred embodiment, the etching plasma with 1000 SCCM of said nitrogen and hydrogen ratio, a predetermined amount of preferably below 4 per cent, especially 1 per cent of $CF_4$ equivalent to 10 sccm, is used to remove the photo resist from said liner 13. With the etchant comprising about 1 per cent $CF_4$, a selectivity from liner 12 to the resist of more than 16 is possible. While using said plasmas in accordance with the preferred embodiments of the present invention, an across wafer non-uniformity of less than 8 per cent, especially less than 4 per cent, could be obtained.

While not shown, it is understood that other elements could be included in the semiconductor substrate 10. Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, methods and steps described in the specification. As one of ordinary skill in the art will readily appreciate from the disclosure of the present invention, processes, manufacture, materials, methods or steps, presently existing or later to be developed, that perform substantially the same function or achieve substantially the same result as the corresponding embodiments described herein may be utilized according to the present invention. Accordingly, the appended claims are intended to include within their scope such processes, manufacture, materials, means, methods or steps.

REFERENCE SIGNS 10 semiconductor substrate/device, preferably Si-wafer
11 recess, preferably rectangular
12 mask, preferably carbon hard mask
13 liner, preferably SiON
14 cavity, especially mask erosion area

What is claimed is:

1. A method for removing a resist from a SiON liner on a hard mask constituted mostly of carbon on a semiconductor substrate, comprising:
    providing an etching plasma comprising at least hydrogen at a predetermined temperature level and a predetermined pressure level in a reaction chamber; and
    etching the resist selectively to the mask with the plasma for a predetermined period of time.

2. The method according to claim 1, wherein the etching plasma comprises of a predetermined amount of nitrogen as a diluent.

3. The method according to claim 2, wherein a ratio of nitrogen to hydrogen is varied starting from a standard nitrogen to hydrogen mixture of 96:4 to a stronger hydrogen rich chemistry based on an intended application.

4. The method according to claim 1, wherein the etching plasma is comprised of a predetermined amount of $CF_4$.

5. The method according to claim 4, wherein the predetermined amount is less than 5 per cent.

6. The method according to claim 1, wherein the etching plasma is free of oxygen.

7. The method according to claim 1, wherein the predetermined pressure level of the etching plasma is in the range of 50 to 300 Pa.

8. The method according to claim 1, wherein the predetermined temperature is in the range of 150° C. to 350° C.

9. The method according to claim 1, wherein the resist is a carbon-based photo resist.

10. The method according to claim 1, wherein the semiconductor substrate is a Si-substrate.

11. The method according to claim 1, wherein the resist has a selectivity to the mask equal or higher than 10.

12. The method according to claim 1, wherein the resist is stripped with an across wafer non-uniformity of <3% one sigma.

13. The method according to claim 1, wherein the resist is stripped completely from the surface of the semiconductor substrate.

* * * * *